(12) United States Patent
Park et al.

(10) Patent No.: US 9,880,231 B2
(45) Date of Patent: Jan. 30, 2018

(54) GEAR DETECTION SWITCH

(71) Applicants: Hyundai Motor Company, Seoul (KR); Daesung Electric Co., Ltd., Ansan-si (KR)

(72) Inventors: Jeong Yeon Park, Jeonju-si (KR); Seag Woo Lee, Gunpo-si (KR); Chang Kyu Han, Seoul (KR)

(73) Assignees: Hyndai Motor Company, Seoul (KR); Daesung Electric Co., Ltd., Ansan-si (KR)

( * ) Notice: Subject to any disclaimer, the term of this patent is extended or adjusted under 35 U.S.C. 154(b) by 369 days.

(21) Appl. No.: 14/462,161

(22) Filed: Aug. 18, 2014

(65) Prior Publication Data
US 2015/0177336 A1    Jun. 25, 2015

(30) Foreign Application Priority Data
Dec. 20, 2013    (KR) .................. 10-2013-0160189

(51) Int. Cl.
| G01D 5/14 | (2006.01) |
| G01R 33/00 | (2006.01) |
| G01M 13/02 | (2006.01) |
| G01R 1/04 | (2006.01) |

(52) U.S. Cl.
CPC ......... *G01R 33/0047* (2013.01); *G01D 5/145* (2013.01); *G01D 5/147* (2013.01); *G01M 13/021* (2013.01); *G01R 1/04* (2013.01)

(58) Field of Classification Search
CPC ..... G01D 5/145; G01D 5/147; G01M 13/021; G01R 33/0047; G01R 33/07

USPC ....................................................... 73/115.02
See application file for complete search history.

(56) References Cited

U.S. PATENT DOCUMENTS

| 5,500,589 | A | * | 3/1996 | Sumcad | G01R 33/09 324/202 |
| 5,729,128 | A | * | 3/1998 | Bunyer | G01B 7/31 324/174 |
| 6,043,646 | A | * | 3/2000 | Jansseune | H03K 17/9515 307/116 |
| 6,291,990 | B1 | * | 9/2001 | Nakane | G01P 1/00 324/207.2 |
| 6,677,747 | B2 | * | 1/2004 | Sakanoue | G01D 11/245 174/520 |

(Continued)

FOREIGN PATENT DOCUMENTS

| JP | H11-257487 A | 9/1999 |
| JP | 2004-264205 A | 9/2004 |

(Continued)

*Primary Examiner* — Freddie Kirkland, III
(74) *Attorney, Agent, or Firm* — Morgan, Lewis & Bockius LLP

(57) ABSTRACT

A gear detection switch apparatus may include a detection unit into which a magnetization target is inserted at a front part thereof, the detection unit having a printed circuit board (PCB), a front housing having an open front end and into which the detection unit is inserted so that a frontal end of the PCB is exposed through the open front end, a rear housing connected to a rear side of the front housing, wherein a connection boundary between the front and rear housings is molded with a molding material, a Hall sensor device coupled to the exposed frontal end of the PCB, and a finishing closure molded over the open front end of the front housing.

4 Claims, 8 Drawing Sheets

(56) References Cited

U.S. PATENT DOCUMENTS

| | | | |
|---|---|---|---|
| 7,441,322 B2* | 10/2008 | Shinjo | G01D 5/147 29/593 |
| 9,057,628 B2* | 6/2015 | Drespling | G01D 5/145 |
| 9,097,507 B2* | 8/2015 | Moonamkandy | G01B 7/30 |
| 2002/0180424 A1* | 12/2002 | Aoki | G01P 1/026 324/173 |
| 2007/0001664 A1* | 1/2007 | Steinbrink | G01D 11/245 324/174 |
| 2012/0306484 A1 | 12/2012 | Mizutani et al. | |
| 2012/0319682 A1* | 12/2012 | Ausserlechner | G01R 33/072 324/252 |

FOREIGN PATENT DOCUMENTS

| | | | | | |
|---|---|---|---|---|---|
| JP | 2009-192436 A | | 8/2009 | | |
| KR | 10-2009-0131497 A | | 12/2009 | | |
| KR | 10-2011-0013697 A | | 2/2011 | | |
| KR | 20110013697 A | * | 2/2011 | ............ | B60K 20/00 |
| KR | 10-2013-0019747 A | | 2/2013 | | |

* cited by examiner

GEAR DETECTION SWITCH

CROSS REFERENCE TO RELATED APPLICATION

The present application claims priority of Korean Patent Application Number 10-2013-0160189 filed Dec. 20, 2013, the entire contents of which application is incorporated herein for all purposes by this reference.

BACKGROUND OF THE INVENTION

Field of the Invention

The present invention relates, in general, to a technique to detect a gear step in a non-contact manner, and more particularly, to a gear detection switch for detecting a gear step, which is driven in a non-contact manner based on a Hall device, thereby operating semi-permanently, compared to a contact-type switch.

Description of Related Art

Generally, although a gear detection switch for a vehicle, which is mounted to a manual transmission, consists mainly of a mechanically contacted type switch, for the purpose of improved responsiveness, prolonged lifetime, manufacture of eco-friendly parts, etc, and due to distribution of hybrid electric vehicles (HEV) or electric vehicles (EV), a non-contact gear detection switch using a Hall device (or Hall IC) has been introduced to vehicles.

A control finger and a rail, which are mounted in a transmission (particularly a manual transmission), are interconnected with a gearshift lever, and in a case where a contact type gear detection switch is mounted therein, when driven by a driver, they rotate about a control shaft so that the rotated control finger press-touches a connection terminal of the switch, thereby generating and transmitting an electrical shift signal.

In contrast, in a case where a Hall device based non-contact type gear detection switch is mounted, the switch generates an electrical shift signal using a Hall voltage which is created by an air gap between the rotating control finger and the switch, and transmits the electrical shift signal.

A conventional contact type gear detection switch is configured such that, when a push rod is pushed by a control finger, a moving contact, which is mounted in the switch, comes into mechanical contact with a terminal to generate a shift signal and then the switch transmits the shift signal to a transmission control unit (TCU). However, the contact type switch has a problem in that a lifetime is relatively short compared to a non-contact type switch, because the switching operation is based on mechanical friction contact.

Further, a conventional non-contact gear detection switch also has a problem in that magnetic polarity of a magnetized magnet, which should be manually mounted in the switch, is misaligned in assembly, causing an error. In addition, in the case where a housing has a press-fit assembly structure, moisture and foreign substances may be easily externally introduced into the housing through the assembly structure. Furthermore, when the housing is resin-molded, the internally mounted magnetized magnet cannot resist the molding (injection molding) temperature, so the magnetic field of the magnet decreases in intensity due to high temperature demagnetization, resulting in reduced operation performance of the switch.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a gear detection switch which is driven in a non-contact type using a Hall device, thereby being operated semi-permanently compared to a contact-type switch.

In an aspect of the present invention, a gear detection switch apparatus may include a detection unit into which a magnetization target is inserted at a front part thereof, the detection unit having a printed circuit board (PCB), a front housing having an open front end and into which the detection unit is inserted so that a frontal end of the PCB is exposed through the open front end, a rear housing connected to a rear side of the front housing, wherein a connection boundary between the front and rear housings is molded with a molding material, a Hall sensor device coupled to the exposed frontal end of the PCB, and a finishing closure molded over the open front end of the front housing.

The magnetization target is magnetized after the finishing closure is molded.

The magnetization target is inserted into the detection unit in a non-magnetized state, and is magnetized after the front and rear housings are connected and the connection boundary is molded.

The detection unit may have a front extension, into which the magnetized target is inserted.

The detection unit may have a front extension, into which the Hall sensor device is coupled.

The detection unit may have a through-hole at a lower end thereof, and the PCB is inserted into the detection unit through the through-hole such that the frontal end of the PCB is positioned at the front end of the detection unit.

The gear detection switch apparatus may further include a control finger which may have a stepped part towards the finishing closure and which is spaced from a front part of the finishing closure, wherein the control finger is configured such that, when a shifting operation is carried out, the control finger slides relative to the finishing closure so that a distance to the Hall sensor device varies.

The stepped part of the control finger is defined by an inclined surface which is formed into a dovetail shape in order not to be exposed towards the Hall sensor device.

In another aspect of the present invention, method of manufacturing the gear detection switch apparatus may include inserting the magnetization target into the front end of the detection unit and coupling the printed circuit board (PCB) to the detection unit, inserting the detection unit into the front housing through the open front end thereof, connecting the rear housing to the front housing, and coupling the Hall sensor device to the frontal end of the PCB, molding the connection boundary between the front and rear housings and the open front end of the front housing with the molding material, and magnetizing the magnetization target.

The magnetization target is magnetized by inserting the front housing into a center of a coil through which current passes.

According to an exemplary embodiment of the present invention, the gear detection switch is driven in a non-contact manner using a Hall device, thereby being operated semi-permanently compared to a contact-type switch.

Further, the gear detection switch is of a non-contact type to detect a variation in intensity of magnetic field using permanent magnets and a Hall IC, without contact damage due to abrasion, thereby having a prolonged lifetime compared to the related art.

Further, the gear detection switch can prevent abrasion of the control finger and contact error due to foreign substance, thereby providing improved responsiveness compared to the related art.

Furthermore, the gear detection switch can detect a multiplicity of air gaps with a single sensor (switch), so, when air gaps in the control finger and rail are collectively formed at one place, it is possible for a single sensor to detect many gear steps in a non-contact manner.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
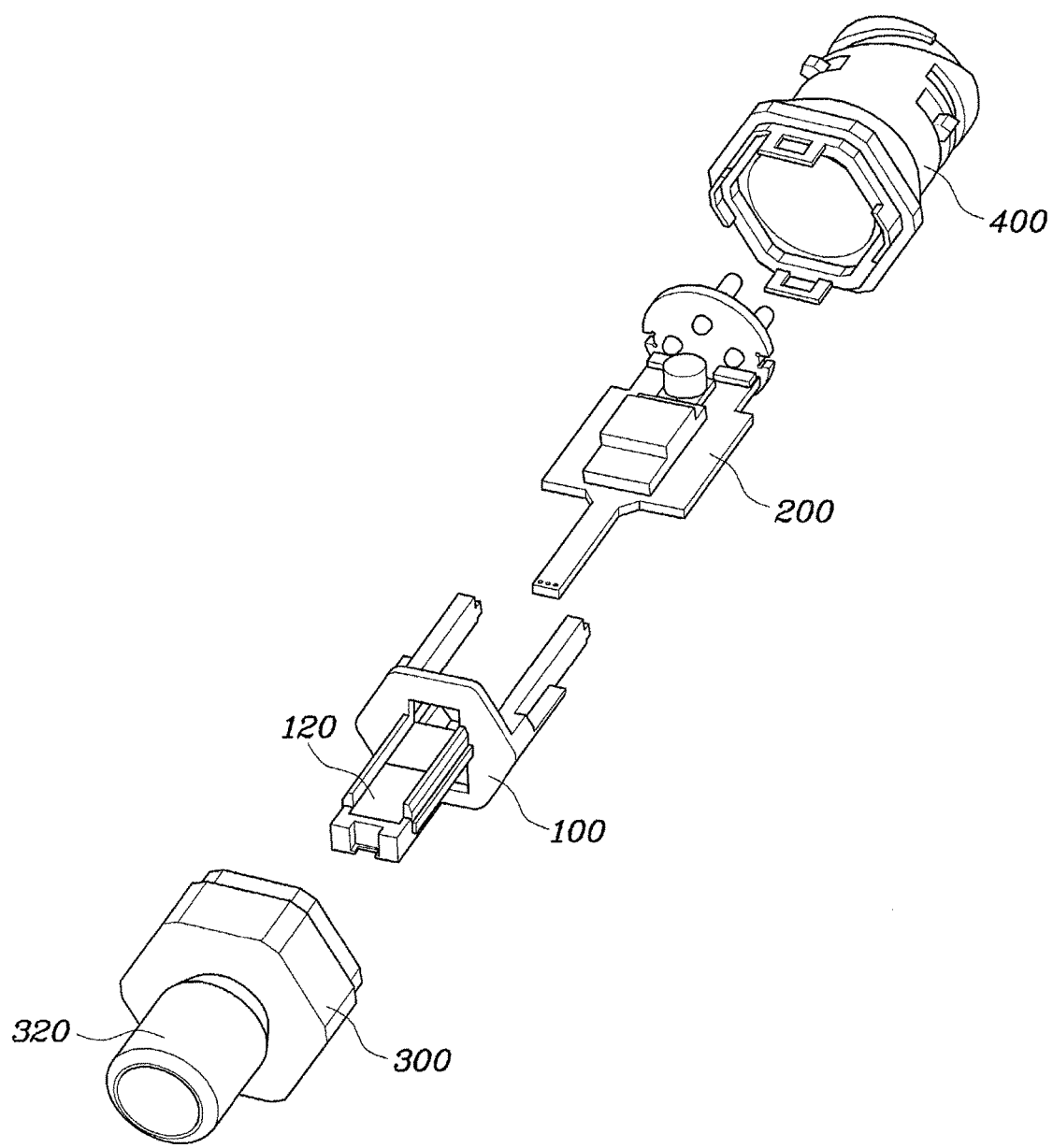
FIG. 1 is an exploded perspective view of a gear detection switch according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Hereinbelow, preferred embodiments of the present invention will be described in detail with reference to the accompanying drawings.

Figure 2:
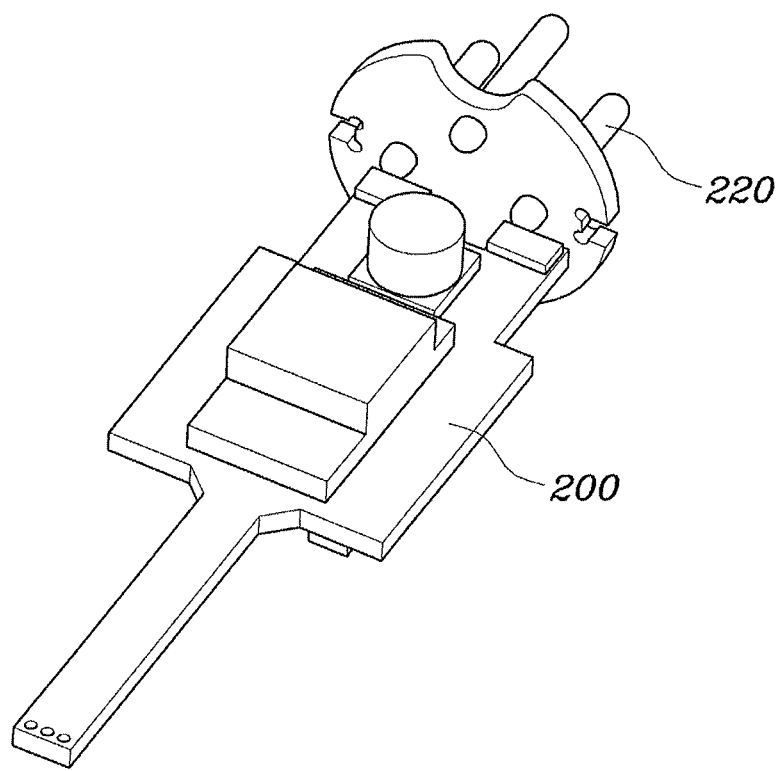
FIG. 2 is a view of a printed circuit board (PCB) of the gear detection switch according to an exemplary embodiment of the present invention.
Figure 3:
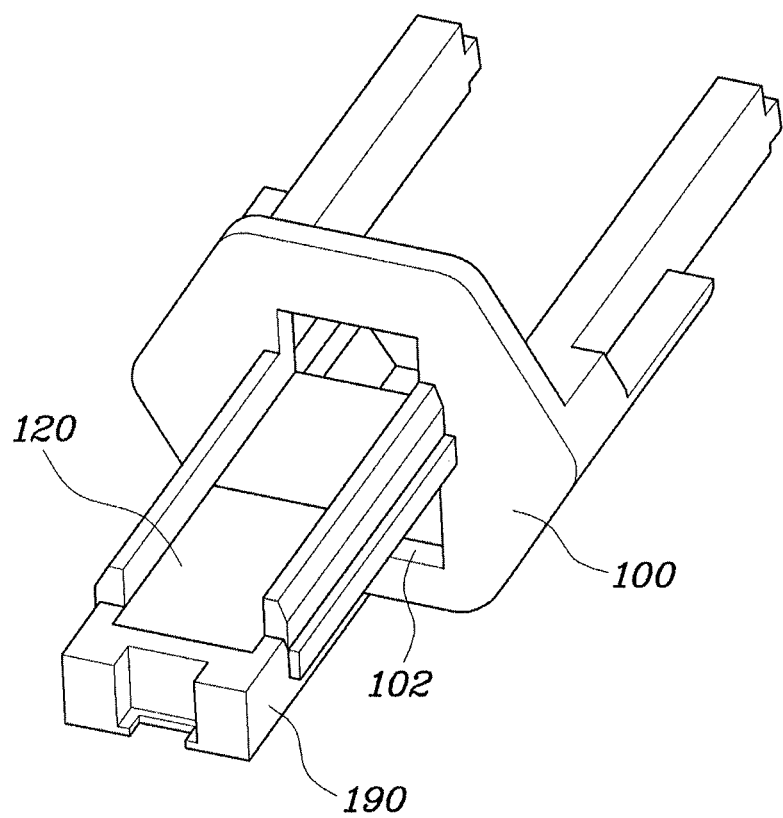
FIGS. 3 and 4 are views of a detection unit of the gear detection switch according to an exemplary embodiment of the present invention.
Figure 4:
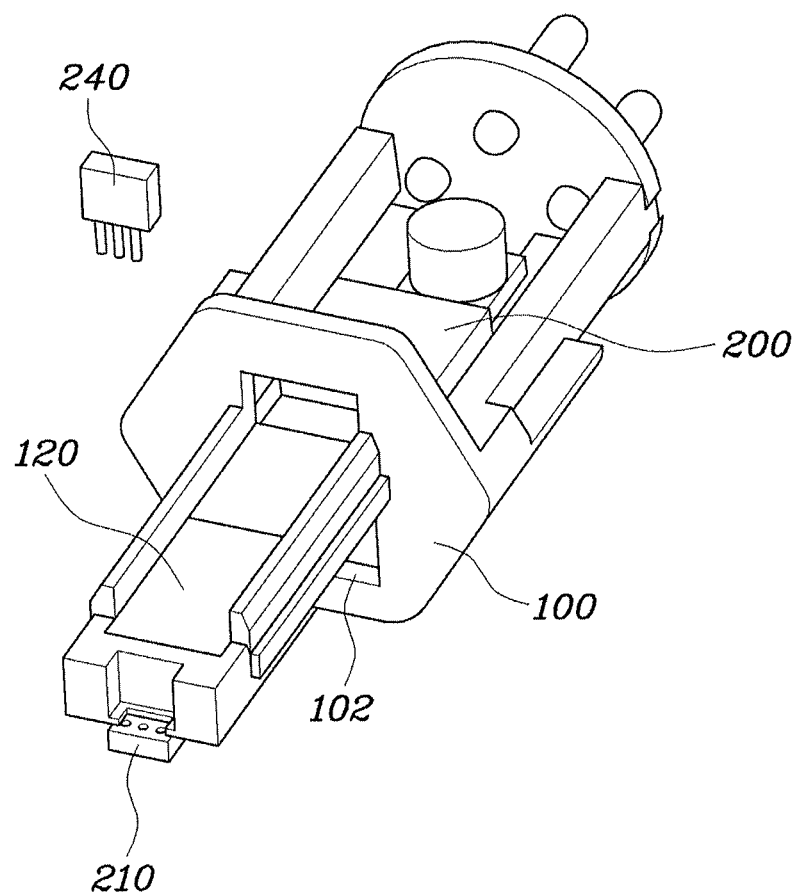
Figure 5:
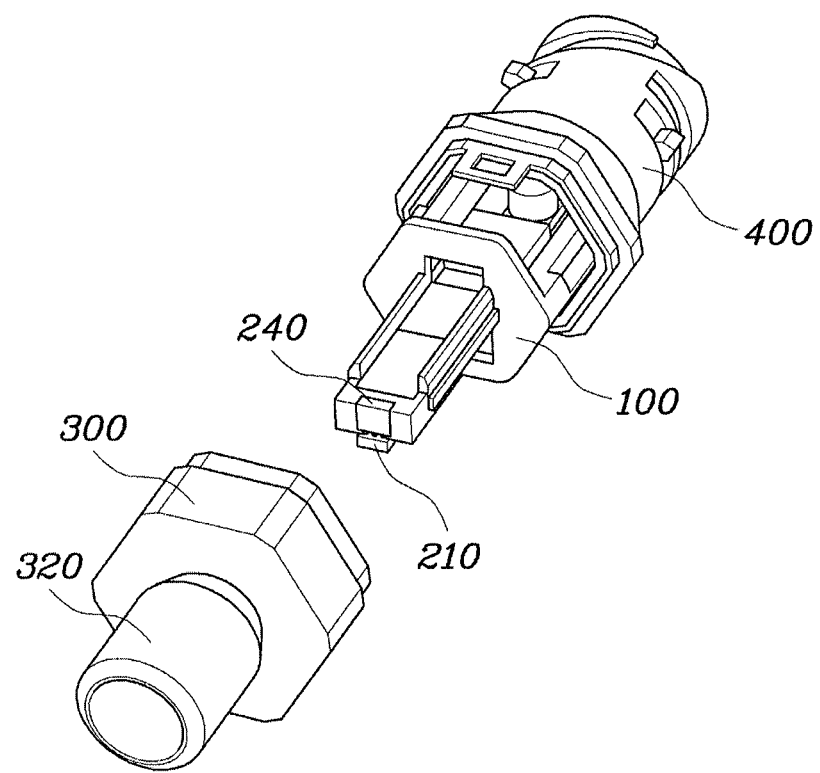
FIGS. 5 and 6 are views of the detection unit of the gear detection switch according to the exemplary embodiment of the present invention.
Figure 6:
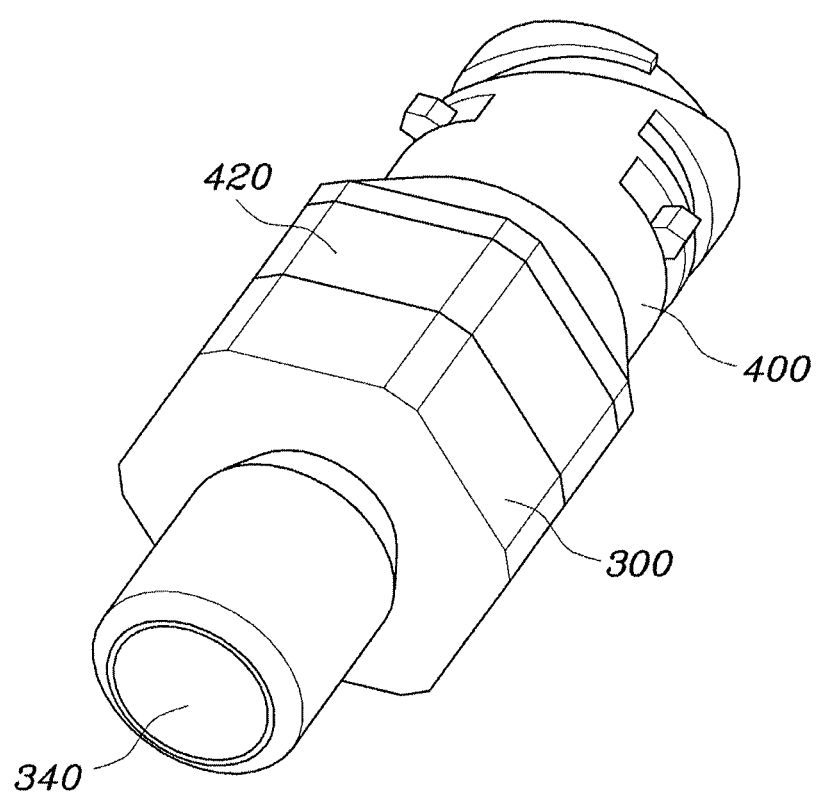
Figure 7:
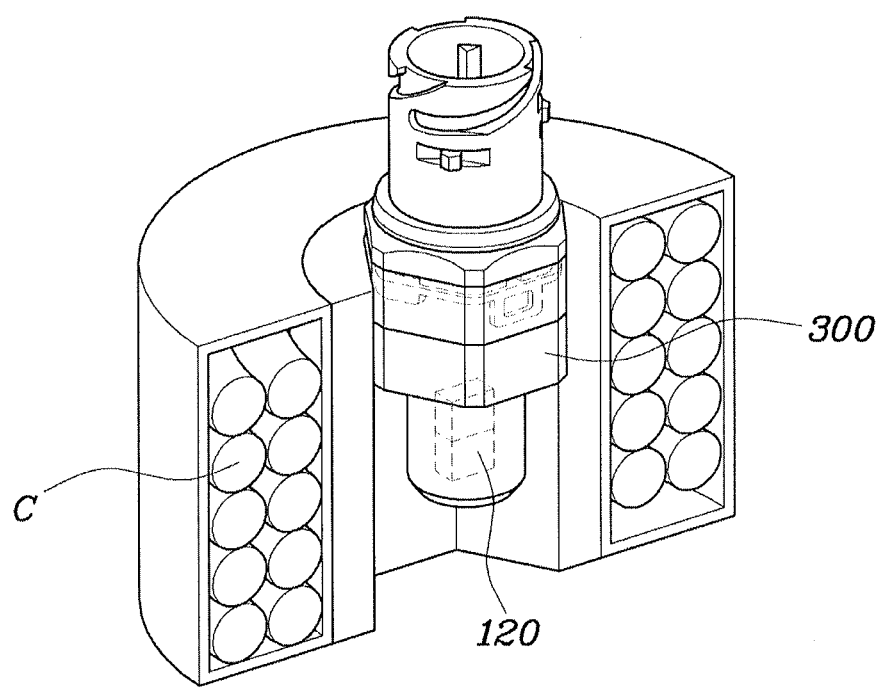
FIG. 7 is a view showing a magnetizing process of the gear detection switch of FIG. 2.
Figure 8:
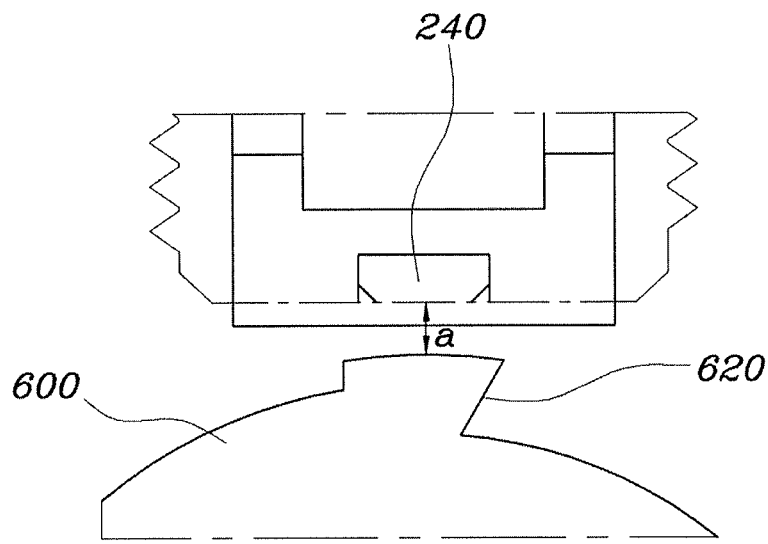
FIGS. 8 and 9 are views showing the operation of the gear detection switch of FIG. 2.
Figure 9:
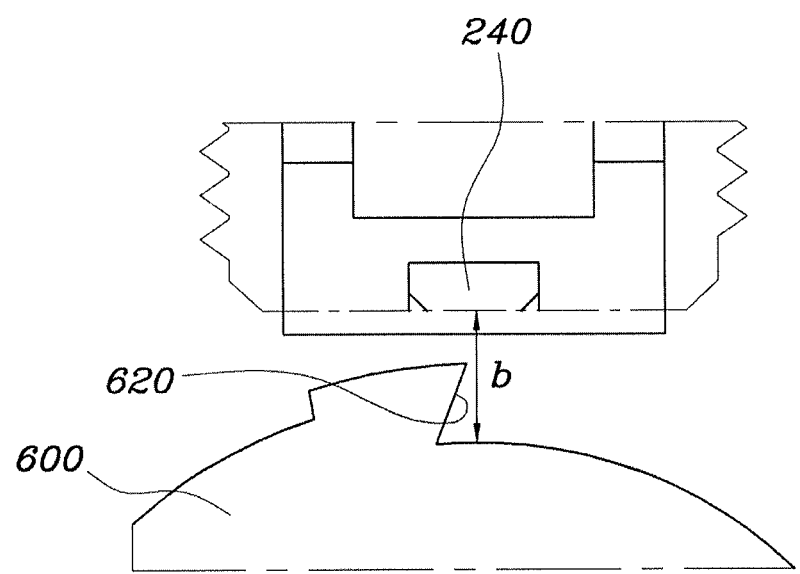

FIG. 1 is an exploded perspective view of a gear detection switch according to an exemplary embodiment of the present invention, FIG. 2 is a view of a printed circuit board (PCB) of the gear detection switch according to an exemplary embodiment of the present invention, FIGS. 3 and 4 are views of a detection unit of the gear detection switch according to an exemplary embodiment of the present invention, FIGS. 5 and 6 are views of the detection unit of the gear detection switch according to the exemplary embodiment of the present invention, FIG. 7 is a view showing a magnetizing process of the gear detection switch of FIG. 2, and FIGS. 8 and 9 are views showing the operation of the gear detection switch of FIG. 2.

The gear detection switch includes a detection unit 100 which has a printed circuit board (PCB) 200 and into which a magnetization target 120 is inserted at a front part thereof, a front housing 300 which has an open front end 320 and into which the detection unit 100 is inserted so that a frontal end of the PCB 200 is exposed through the open front end 320, a rear housing 400 which is connected to a rear side of the front housing 300, wherein a connection boundary 420 between the front and rear housings is molded with a molding material, a Hall sensor device 240 which is coupled to the exposed frontal end of the PCB 200, and a finishing closure 340 which is molded over the open front end 320 of the front housing 300.

As shown in FIG. 1, the detection unit 100 accommodates the magnetization target 120 therein. Specifically, the magnetization target 120 is inserted into the detection unit as shown in FIG. 3. In this case, the magnetization target 120 has not been yet magnetized.

The detection unit 100 is provided with the PCB 200. Specifically, wires 220 are soldered to the PCB 200 as shown in FIG. 2. Also, as shown in FIG. 3, the detection unit 100 has a frontal extension 190 into which the magnetization target 120 is inserted. The detection unit 100 has, at a lower part thereof, a through-hole 102 through which the PCB 200 is inserted into the detection unit such that the frontal end of the PCB is located at the front end of the detection unit 100.

The detection unit 100 is inserted into the front housing 300 so that the frontal end of the PCB 200 is exposed to the outside through the open front end 320 of the front housing. The Hall sensor device 240 is coupled to the exposed frontal end of the PCB 200. Specifically, this connection is shown in FIGS. 4 and 5.

The rear housing 400 is connected to the rear side of the front housing 300, and the connection boundary with respect to the front housing 300 is molded with a molding material 420. Further, the open front end 320 of the front housing 300 is molded with a molding material to form the finishing closure 340. Like this, after the front and rear housings are connected together, the connection boundary is molded, and finally the finishing closure 340 is molded, the magnetization target 120 may then be magnetized. Otherwise, the magnetization target 120 may be magnetized after being inserted into the detection unit 100 in a non-magnetized state and then the connection boundary between the front and rear housings is over-molded with a molding material 420.

That is, the over-molding provides a waterproof sealing and the post-magnetization prevents high temperature demagnetization.

Further, as shown in FIGS. 8 and 9, the gear detection switch may further include a control finger 600 which has a stepped part towards the finishing closure and which is spaced a specified distance from a front part of the finishing closure 340, wherein the control finger is configured such that, when a shifting operation is carried out, the control finger slides relative to the finishing closure so that a distance (a or b) to the Hall sensor device 240 varies. The stepped part of the control finger 600 may be defined by an inclined surface 620 which is formed into a dovetail shape in order not to be exposed towards the Hall sensor device 240.

That is, a position of the gear step is tracked by measuring a distance from the stepped part of the control finger 600 to the Hall sensor device 240. In addition, the surface 620 to form the stepped part is inclined in a dovetail shape such that, as viewed from the Hall sensor device 240, the inclined surface cannot be seen, so that the distance varies sharply (a or b) without having an intermediate value. This configuration enables simple, easy, and stable control.

In another aspect, the present invention provides a method of manufacturing the gear detection switch.

The method includes, inserting a magnetization target 120 into a front end of a detection unit 100 as shown in FIG. 3 and coupling a printed circuit board (PCB) 200 to the detection unit as shown in FIG. 4, inserting the detection unit 100 into a front housing 300 through an open front end thereof as shown in FIG. 5, connecting a rear housing 400 to the front housing as shown in FIG. 6, and coupling a Hall sensor device 240 to a frontal end of the PCB 200, molding a connection boundary between the front and rear housings 300 and 400 and the open front end 320 of the front housing 300 with a molding material as shown in FIG. 6, and magnetizing the magnetization target 120 as shown in FIG. 7.

As shown in FIG. 7, the magnetization target 120 may be magnetized by inserting the front housing into the center of a coil C through which current passes.

According to an exemplary embodiment of the present invention, a non-magnetized magnet is insert-molded without manual assembly of a permanent magnet, so a polarity error due to an arrangement error of magnet during assembly can be prevented. Further, the magnet is finally magnetized using a magnetizer after over-molding the switch, so high temperature demagnetization that may occur during a molding process can be prevented. Further, the entire of the switch is over-molded, so external moisture and foreign substances cannot be introduced.

Further, the control finger has a detecting protrusion which is tapered in a dovetail shape, thereby preventing a detection error with respect to gear step.

According to an exemplary embodiment of the present invention, the gear detection switch is driven in a non-contact type using a Hall device, thereby being operated semi-permanently compared to a contact-type switch.

Further, the gear detection switch is of a non-contact type to detect a variation in intensity of magnetic field using permanent magnets and a Hall IC, without contact damage due to abrasion, thereby having a prolonged lifetime compared to the related art.

Further, the gear detection switch can prevent abrasion of the control finger and contact error due to foreign substances, thereby providing improved responsiveness compared to the related art.

Furthermore, the gear detection switch can detect a multiplicity of air gaps with a single sensor (switch), so, when air gaps in the control finger and rail are collectively formed at one place, it is possible for a single sensor to detect many gear steps in a non-contact manner.

For convenience in explanation and accurate definition in the appended claims, the terms "upper", "lower", "inner" and "outer" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A gear detection switch apparatus comprising:
   a detection unit into which a magnetization target is inserted at a front part thereof, the detection unit having a printed circuit board (PCB);
   a front housing having an open front end and into which the detection unit is inserted so that a frontal end of the PCB is exposed through the open front end;
   a rear housing connected to a rear side of the front housing, wherein a connection boundary between the front and rear housings is molded with a molding material;
   a Hall sensor device coupled to the exposed frontal end of the PCB;
   a finishing closure molded over the open front end of the front housing; and
   a control finger which has a stepped part towards the finishing closure and which is spaced from a front part of the finishing closure, wherein the control finger is configured such that, when a shifting operation is carried out, the control finger slides relative to the finishing closure so that a distance between the control finger and the Hall sensor device varies,
   wherein the stepped part of the control finger is defined by an inclined surface which is formed into a dovetail shape and wherein a radial axis of the control finger passing a distal end of the inclined surface has an acute angle with an imaginary axis aligned on the inclined surface passing the distal end in order not to be exposed towards the Hall sensor device.

2. The gear detection switch apparatus according to claim 1, wherein the detection unit has a front extension, into which the magnetized target is inserted.

3. The gear detection switch apparatus according to claim 2, wherein the detection unit has a front extension, into which the Hall sensor device is coupled.

4. The gear detection switch apparatus according to claim 1, wherein the detection unit has a through-hole at a lower end thereof, and the PCB is inserted into the detection unit through the through-hole such that the frontal end of the PCB is positioned at the front end of the detection unit.

* * * * *